United States Patent
Ebe et al.

(10) Patent No.: US 8,828,753 B2
(45) Date of Patent: Sep. 9, 2014

(54) PRODUCING METHOD OF LIGHT EMITTING DIODE DEVICE

(71) Applicant: Nitto Denko Corporation, Ibaraki (JP)

(72) Inventors: Yuki Ebe, Ibaraki (JP); Yasunari Ooyabu, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/711,159

(22) Filed: Dec. 11, 2012

(65) Prior Publication Data
US 2013/0164869 A1   Jun. 27, 2013

(30) Foreign Application Priority Data
Dec. 26, 2011 (JP) .................................. 2011-284488

(51) Int. Cl.
*H01L 21/00* (2006.01)
*H01L 33/50* (2010.01)
*H01L 33/52* (2010.01)

(52) U.S. Cl.
CPC ................ *H01L 33/50* (2013.01); *H01L 33/52* (2013.01); *H01L 2933/0041* (2013.01); *H01L 33/507* (2013.01)
USPC ............... 438/27; 438/10; 438/126; 438/127; 257/E33.068; 257/E33.001; 257/E21.499; 257/E51.02

(58) Field of Classification Search
CPC ....... H01L 33/50; H01L 33/507; H01L 33/52; H01L 2933/0041
USPC .............. 438/10, 27, 126, 127; 257/E33.068, 257/E33.001, E21.499, E51.02
See application file for complete search history.

(56) References Cited

U.S. PATENT DOCUMENTS

| | | | |
|---|---|---|---|
| 2004/0124430 A1* | 7/2004 | Yano et al. | 257/98 |
| 2008/0076198 A1* | 3/2008 | Park et al. | 438/27 |
| 2010/0181582 A1* | 7/2010 | Li et al. | 257/91 |
| 2010/0308354 A1* | 12/2010 | David et al. | 257/98 |
| 2011/0031516 A1* | 2/2011 | Basin et al. | 257/98 |

FOREIGN PATENT DOCUMENTS

| | | |
|---|---|---|
| JP | 2007-227677 A | 9/2007 |
| JP | 2010-123802 A | 6/2010 |

* cited by examiner

*Primary Examiner* — Michelle Mandala
(74) *Attorney, Agent, or Firm* — Sughrue Mion, PLLC

(57) ABSTRACT

A method for producing a light emitting diode device includes the steps of preparing a board mounted with a light emitting diode; preparing a hemispherical lens molding die; preparing a light emitting diode encapsulating material which includes a light emitting diode encapsulating layer and a phosphor layer laminated thereon, and in which both layers are prepared from a resin before final curing; and disposing the light emitting diode encapsulating material between the board and the lens molding die so that the phosphor layer is opposed to the lens molding die to be compressively molded, so that the light emitting diode is directly encapsulated by the hemispherical light emitting diode encapsulating layer and the phosphor layer is disposed on the hemispherical surface thereof.

3 Claims, 3 Drawing Sheets

(a)

(b)

(c)

(d)

(e)

(f)

PRODUCING METHOD OF LIGHT EMITTING DIODE DEVICE

CROSS-REFERENCE TO RELATED APPLICATION

The present application claims priority from Japanese Patent Application No. 2011-284488 filed on Dec. 26, 2011, the contents of which are hereby incorporated by reference into this application.

BACKGROUND OF THE INVENTION

1. Field of the Invention

The present invention relates to a method for producing a light emitting diode device using a light emitting diode encapsulating material.

2. Description of Related Art

In recent years, as a light emitting device which is capable of emitting high-energy light, a white light emitting device has been known. In the white light emitting device, for example, an LED (a light emitting diode) which emits blue light, and a phosphor layer which is capable of converting the blue light into yellow light and covers the LED are provided. The white light emitting device emits high-energy white light by color mixing of the blue light emitted from the LED and the yellow light converted from the blue light in the phosphor layer.

As a method for producing a light emitting device, for example, a producing method of a light emitting device in which after an LED chip is mounted on a mounting board, the LED chip is covered with a first encapsulating resin; then, a second encapsulating resin made of the same material as that of the first encapsulating resin is injected into the inner side of an optical member in a dome shape; thereafter, the optical member and the mounting board are positioned and the encapsulating resins are cured, so that an encapsulating portion is formed; and subsequently, a color conversion member in a dome shape formed from a phosphor and a light transmissive resin is disposed on the mounting board by a locking claw has been proposed (ref: for example, Japanese Unexamined Patent Publication No. 2007-227677).

SUMMARY OF THE INVENTION

However, in the method described in Japanese Unexamined Patent Publication No. 2007-227677, first, the encapsulating portion for encapsulating the LED chip is formed and thereafter, the color conversion member which is separately prepared is disposed on the encapsulating portion. Therefore, there is a disadvantage that the number of operating steps is large and the accuracy of positioning is required, so that the operation is complicated.

It is an object of the present invention to provide a method for producing a light emitting diode device in which a light emitting diode device is capable of being produced easily and accurately with a small number of operating steps.

A method for producing a light emitting diode device of the present invention includes the steps of preparing a board mounted with a light emitting diode; preparing a hemispherical lens molding die; preparing a light emitting diode encapsulating material which includes a light emitting diode encapsulating layer and a phosphor layer laminated on the light emitting diode encapsulating layer, and in which both of the light emitting diode encapsulating layer and the phosphor layer are prepared from a resin before final curing; and disposing the light emitting diode encapsulating material between the board and the lens molding die so that the phosphor layer is opposed to the lens molding die to be compressively molded, so that the light emitting diode is directly encapsulated by the hemispherical light emitting diode encapsulating layer and the phosphor layer is disposed on the hemispherical surface of the light emitting diode encapsulating layer.

According to the method for producing a light emitting diode device, by performing compression molding, the light emitting diode is encapsulated by the hemispherical light emitting diode encapsulating layer and at the same time, the phosphor layer can be disposed on the hemispherical surface of the light emitting diode encapsulating layer.

Therefore, according to the method for producing a light emitting diode device, the light emitting diode device can be produced easily and accurately with a small number of operating steps.

In the method for producing a light emitting diode device of the present invention, it is preferable that the phosphor layer is disposed at a substantially equal distance from the central point of the light emitting diode.

According to the method for producing a light emitting diode device, the light distribution characteristics can be improved and the light emitting diode device which is capable of widely emitting light can be produced.

In the method for producing a light emitting diode device of the present invention, it is preferable that the resin before final curing is a first-step cured material of a two-step curable resin and/or a thermoplastic material of a resin having both thermoplastic properties and thermosetting properties.

According to the method for producing a light emitting diode device, the light emitting diode encapsulating material is a first-step cured material of a two-step curable resin and/or a thermoplastic material of a resin having both thermoplastic properties and thermosetting properties, so that the handling ability of the light emitting diode encapsulating material is excellent and the final curing of the light emitting diode encapsulating material can be surely achieved.

According to the method for producing a light emitting diode device of the present invention, the light emitting diode is encapsulated by the hemispherical light emitting diode encapsulating layer prepared from the resin before final curing and at the same time, the phosphor layer can be disposed on the hemispherical surface thereof, so that the light emitting diode device is capable of being produced easily and accurately with a small number of operating steps.

(a) illustrating a step of preparing a board mounted with a light emitting diode, (b) illustrating a step of preparing a hemispherical lens molding die, and (c) illustrating a step of preparing a light emitting diode encapsulating layer and a phosphor layer.

Figure 1:
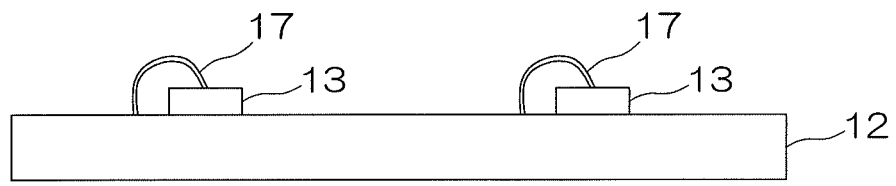
FIG. 1 shows process drawings for illustrating one embodiment of a method for producing a light emitting diode device of the present invention.
Figure 1:
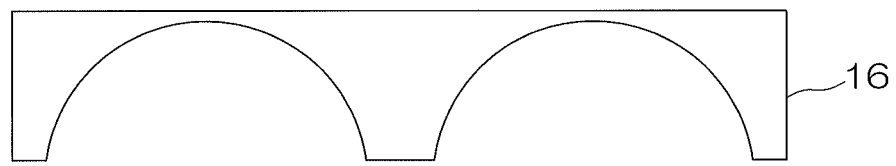
Figure 1:
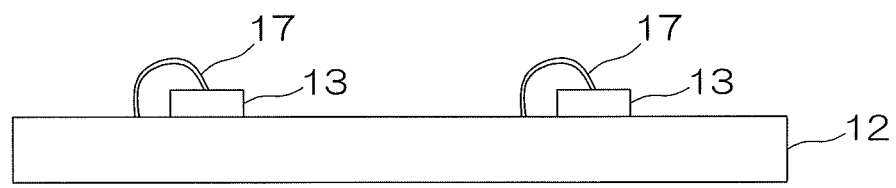
Figure 1:
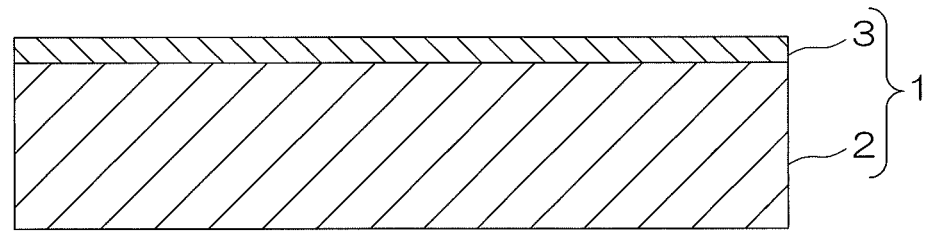
Figure 2:
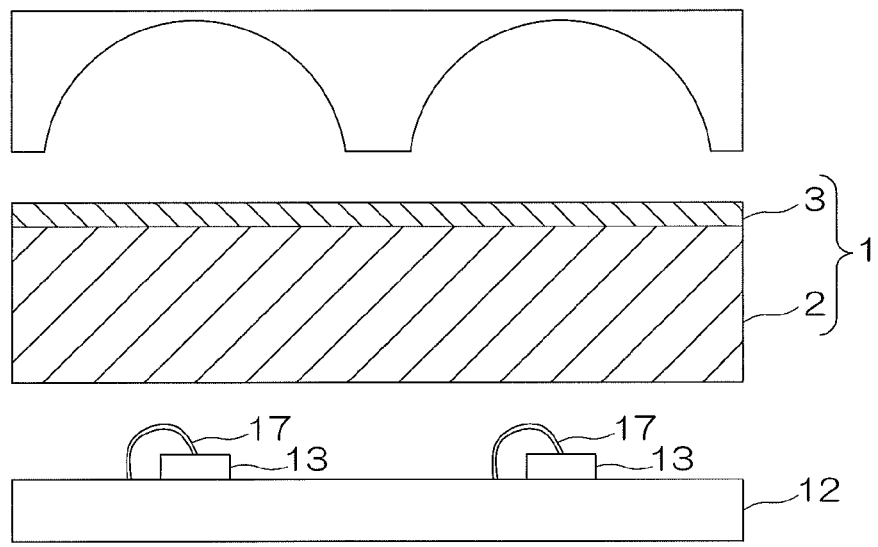
Figure 2:
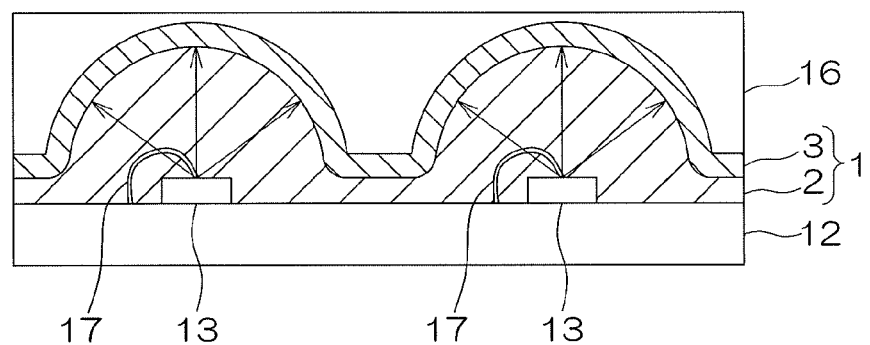
Figure 2:
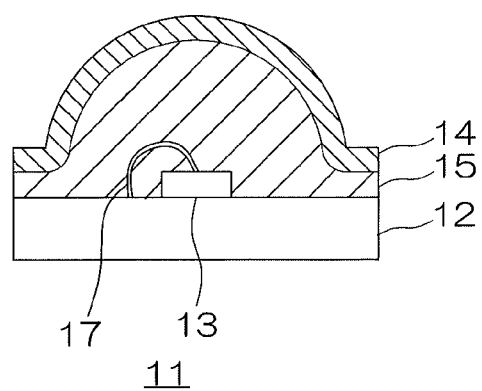

FIG. 2 shows process drawings for illustrating one embodiment of a method for producing a light emitting diode device of the present invention, subsequent to FIG. 1:

(d) illustrating a step of disposing a light emitting diode encapsulating material between the board and the lens molding die so that the phosphor layer is opposed to the lens molding die, (e) illustrating a step of compressively molding the light emitting diode encapsulating material, and (f) illustrating a step of opening the hemispherical lens molding die to cut the molded product into a single piece.

Figure 3:
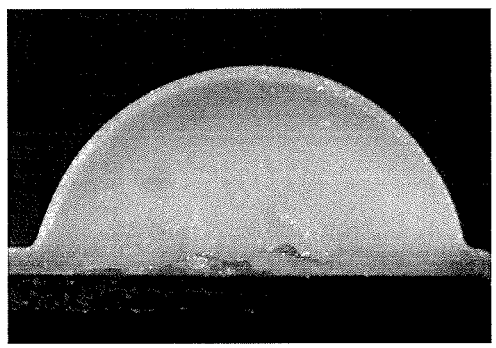

FIG. 3 shows a sectional photographic view of the light emitting diode device of Example 1.

DETAILED DESCRIPTION OF THE INVENTION

FIG. 1 shows process drawings for illustrating one embodiment of a method for producing a light emitting diode device of the present invention. FIG. 2 shows process drawings for illustrating one embodiment of a method for producing a light emitting diode device of the present invention, subsequent to FIG. 1.

In the following, one embodiment of a method for producing a light emitting diode device of the present invention is described with reference to FIGS. 1 and 2.

In this method, first, as shown in FIG. 1 (a), a board 12 mounted with light emitting diodes 13 is prepared.

The board 12 is formed of, for example, a lead frame prepared by plating copper with silver.

On the upper surface of the board 12, a wire (not shown) for electrically connecting a terminal (not shown) of the light emitting diode 13 with a terminal (not shown) of a power source for supplying electricity to the light emitting diode 13 is formed.

An example of the light emitting diode 13 includes a blue light emitting diode (a blue LED) which emits mainly blue light.

A plurality (in FIGS. 1 and 2, two pieces are shown) of the light emitting diodes 13 are disposed on the upper surface of the board 12. The terminal (not shown) of the light emitting diodes 13 is electrically connected (wire bonded) to the wire which is not shown via wires 17.

Next, in this method, as shown in FIG. 1 (b), a hemispherical lens molding die 16 is prepared.

The lens molding die 16 is a molding die prepared by, for example, plating stainless steel with hard chromium. The lens molding die 16 includes a plurality (in FIGS. 1 and 2, two pieces are shown) of dents each of which has a shape corresponding to that of a phosphor cover 14 (described later), that is, hemispherical dents, corresponding to the light emitting diodes 13.

Next, in this method, as shown in FIG. 1 (c), a light emitting diode encapsulating material 1 is prepared.

The light emitting diode encapsulating material 1 includes a light emitting diode encapsulating layer 2 and a phosphor layer 3 laminated on the light emitting diode encapsulating layer 2.

The light emitting diode encapsulating layer 2 is a resin layer which is capable of encapsulating the light emitting diodes 13 and transmitting through light. The light emitting diode encapsulating layer 2 is formed from a resin which is a resin capable of transmitting through light and not to be finally cured into a flat plate shape in a generally rectangular shape in plane view.

Examples of the resin before final curing include a first-step cured material (before curing in the second step) of a two-step curable resin and a thermoplastic material (before thermal curing) of a resin having both thermoplastic properties and thermosetting properties.

When the light emitting diode encapsulating layer 2 is a first-step cured material of a two-step curable resin and/or a thermoplastic material of a resin having both thermoplastic properties and thermosetting properties, the handling ability of the light emitting diode encapsulating layer 2 is excellent and the final curing of the light emitting diode encapsulating layer 2 can be surely achieved.

The two-step curable resin is defined as a resin which has a two-step reaction mechanism and in which the resin is brought into a semi-cured state (into a B-stage state) in the first-step reaction and is subjected to a final curing in the second-step reaction.

The B-stage state is a state between an A-stage state in which a resin is soluble in a solvent and a C-stage state in which a resin is subjected to a final curing. Also, the B-stage state is a state in which the curing and the gelation of the resin are slightly progressed to be swollen but not to be completely dissolved in a solvent and also to be softened but not to be melted by heating.

Examples of an uncured material (before curing in the first step) of the two-step curable resin include an epoxy resin composition and a silicone resin composition. Preferably, a silicone resin composition is used.

When the silicone resin composition is used as the uncured material (before curing in the first step) of the two-step curable resin, an excellent light resistance and heat resistance can be ensured.

An example of the silicone resin composition includes a condensation reaction and addition reaction type silicone resin composition.

The condensation reaction and addition reaction type silicone resin composition is a silicone resin composition which can undergo a condensation reaction and an addition reaction (to be specific, a hydrosilylation reaction) by heating. To be more specific, the condensation reaction and addition reaction type silicone resin composition is a silicone resin composition which can be brought into a B-stage state (a semi-cured state) by undergoing the condensation reaction by heating and then, be brought into a cured (final cured) state by undergoing the addition reaction (to be specific, for example, the hydrosilylation reaction) by further heating.

Examples of the condensation reaction and addition reaction type silicone resin composition include a first thermosetting silicone resin composition which contains a polysiloxane containing silanol groups at both ends, an alkenyl group-containing alkoxysilane, and an organohydrogensiloxane; a second thermosetting silicone resin composition which contains a polysiloxane containing silanol groups at both ends, a silicon compound containing an ethylenically unsaturated hydrocarbon group, an epoxy group-containing silicon compound, and an organohydrogensiloxane; a third thermosetting silicone resin composition which contains a first organopolysiloxane having, in one molecule, at least two alkenylsilyl groups, a second organopolysiloxane having, in one molecule, at least two hydrosilyl groups, a hydrosilylation catalyst, and a curing retarder; a fourth thermosetting silicone resin composition which contains a first organopolysiloxane having, in one molecule, both at least two ethylenically unsaturated hydrocarbon groups and at least two hydrosilyl groups, a second organopolysiloxane having, in one molecule, at least two hydrosilyl groups without containing an ethylenically unsaturated hydrocarbon group, a hydrosilylation catalyst, and a hydrosilylation retarder; and a fifth thermosetting silicone resin composition which contains a first organopolysiloxane having, in one molecule, both at least two ethylenically unsaturated hydrocarbon groups and at least two silanol groups, a second organopolysiloxane having, in one molecule, at least two hydrosilyl groups without containing an ethylenically unsaturated hydrocarbon group, and a hydrosilylation catalyst.

These condensation reaction and addition reaction type silicone resin compositions can be used alone or in combination of two or more.

As the condensation reaction and addition reaction type silicone resin composition, preferably, a first thermosetting silicone resin composition is used.

In the first thermosetting silicone resin composition, the polysiloxane containing silanol groups at both ends and the alkenyl group-containing alkoxysilane are condensation materials (materials subjected to a condensation reaction) and the alkenyl group-containing alkoxysilane and the organohydrogensiloxane are addition materials (materials subjected to an addition reaction).

The polysiloxane containing silanol groups at both ends is a silane compound which contains silanol groups (SiOH groups) at both ends of a molecule and to be specific, is represented by the following formula (1).

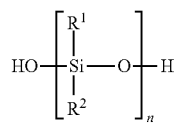 (1)

(where, in formula (1), $R^1$ and $R^2$ are monovalent hydrocarbon groups. "n" represents an integer of 2 or more. $R^1$ and $R^2$ are the same or different from each other.)

In the above-described formula (1), preferably, $R^1$ and $R^2$ are the same.

An example of the monovalent hydrocarbon group represented by $R^1$ and $R^2$ includes a saturated or unsaturated, straight chain, branched chain, or cyclic hydrocarbon group. The number of carbon atoms of the hydrocarbon group is, in view of easy preparation or thermal stability, for example, 1 to 20, or preferably 1 to 10.

To be specific, examples of the monovalent hydrocarbon group include a saturated aliphatic hydrocarbon group such as methyl, ethyl, propyl, isopropyl, butyl, isobutyl, pentyl, cyclopentyl, hexyl, and cyclohexyl and an aromatic hydrocarbon group such as phenyl and naphthyl.

As the monovalent hydrocarbon group, preferably, a saturated aliphatic hydrocarbon group is used, or more preferably, in view of transparency and light resistance, methyl is used.

In the above-described formula (1), "n" is preferably, in view of stability and/or handling ability, an integer of 2 to 10000, or more preferably an integer of 2 to 1000.

To be specific, examples of the polysiloxane containing silanol groups at both ends include a polydimethylsiloxane containing silanol groups at both ends, a polymethylphenylsiloxane containing silanol groups at both ends, and a polydiphenylsiloxane containing silanol groups at both ends. Preferably, a polydimethylsiloxane containing silanol groups at both ends is used.

A commercially available product can be used as the polysiloxane containing silanol groups at both ends. A polysiloxane containing silanol groups at both ends synthesized in accordance with a known method can be also used.

These polysiloxanes containing silanol groups at both ends can be used alone or in combination of two or more.

The polysiloxane containing silanol groups at both ends is a mixture of compounds in which "n"s are usually different from each other (that is, the molecular weights are different).

Accordingly, "n" in the above-described formula (1) is calculated as an average value.

The number average molecular weight of the polysiloxane containing silanol groups at both ends is, in view of stability and/or handling ability, for example, 100 to 1000000, or preferably 200 to 100000. The number average molecular weight is calculated by conversion based on standard polystyrene with a gel permeation chromatography. The number average molecular weight to be described later is also calculated in the same manner as that described above.

The mixing ratio of the polysiloxane containing silanol groups at both ends with respect to the total amount of the condensation material is, for example, 1 to 99.99 mass %, preferably 50 to 99.9 mass %, or more preferably 80 to 99.5 mass %.

The alkenyl group-containing alkoxysilane is a silane compound which contains both an alkenyl group and an alkoxy group and to be specific, is an alkenyl group-containing trialkoxysilane represented by the following formula (2).

 (2)

(where, in formula (2), $R^3$ is a straight chain or a cyclic alkenyl group and $R^4$ is a monovalent hydrocarbon group. $R^3$ and $R^4$ are different from each other.)

The number of carbon atoms of the alkenyl group represented by $R^3$ is, in view of easy preparation or thermal stability, for example, 2 to 20, or preferably 2 to 10.

To be specific, examples of the alkenyl group include a straight chain alkenyl group such as a vinyl group, an allyl group, a propenyl group, a butenyl group, a pentenyl group, a hexenyl group, a heptenyl group, and an octenyl group and a cyclic alkenyl group such as a norbornenyl group and a cyclohexenyl group.

Preferably, a straight chain alkenyl group is used, or more preferably, in view of reactivity in an addition reaction, a vinyl group is used.

An example of the monovalent hydrocarbon group represented by $R^4$ includes the same monovalent hydrocarbon group as that represented by $R^1$ and $R^2$ in the above-described formula (1). Preferably, methyl is used.

To be specific, examples of the alkenyl group-containing alkoxysilane include vinyltrialkoxysilane such as vinyltrimethoxysilane, vinyltriethoxysilane, and vinyltripropoxysilane; allyltrimethoxysilane; propenyltrimethoxysilane; butenyltrimethoxysilane; pentenyltrimethoxysilane; hexenyltrimethoxysilane; heptenyltrimethoxysilane; octenyltrimethoxysilane; norbornenyltrimethoxysilane; and cyclohexenyltrimethoxysilane.

Preferably, vinyltrialkoxysilane is used, or more preferably, vinyltrimethoxysilane is used.

These alkenyl group-containing alkoxysilanes can be used alone or in combination of two or more.

A commercially available product can be used as the alkenyl group-containing alkoxysilane. An alkenyl group-containing alkoxysilane synthesized in accordance with a known method can be also used.

The mixing ratio of the alkenyl group-containing trialkoxysilane with respect to the total amount of the condensation material is, for example, 0.01 to 90 mass %, preferably 0.01 to 50 mass %, or more preferably 0.01 to 10 mass %.

The molar ratio ($SiOH/SiOR^4$) of the silanol group (SiOH group) in the polysiloxane containing silanol groups at both ends to the alkoxysilyl group ($SiOR^4$ group) in the alkenyl group-containing alkoxysilane is, for example, 20/1 to 0.2/1, preferably 10/1 to 0.5/1, or more preferably substantially 1/1.

When the molar ratio exceeds the above-described range, there may be a case where a product in a B-stage state (a semi-cured product) having an appropriate toughness is not obtained when the silicone resin composition is brought into a B-stage state. On the other hand, when the molar ratio is below the above-described range, the mixing proportion of the alkenyl group-containing alkoxysilane is excessively large, so that the heat resistance of the resin layer (the light emitting diode encapsulating layer 2) to be obtained may be defective.

When the molar ratio is within the above-described range (preferably, substantially 1/1), the silanol group (the SiOH group) in the polysiloxane containing silanol groups at both ends and the alkoxysilyl group (the SiOR$^4$ group) in the alkenyl group-containing alkoxysilane can be subjected to a condensation reaction neither too much nor too little.

The organohydrogensiloxane is a compound which contains a hydrogen atom directly bonded to a silicon atom in the main chain. Examples of the organohydrogensiloxane include a hydride compound represented by the following formula (3) and containing a hydrogen atom directly bonded to a silicon atom in the middle (between the both ends) of the main chain or a hydride compound (a polysiloxane containing hydrosilyl groups at both ends) represented by the following formula (4) and containing hydrogen atoms directly bonded to silicon atoms at both ends of the main chain.

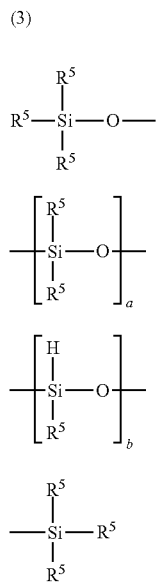

(where, in formula (3), I, II, III, and IV represent a constituent unit, I and IV represent an end unit, and II and III represent a repeating unit. R$^5$s are the same or different from each other and represent monovalent hydrocarbon groups. "a" represents an integer of 0 or 1 or more and "b" represents an integer of 2 or more.)

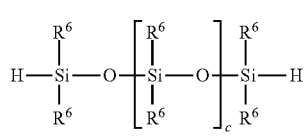

(where, in formula (4), R$^6$s are the same or different from each other and represent monovalent hydrocarbon groups. "c" represents an integer of 1 or more.)

Preferably, R$^5$ in the constituent unit I, R$^5$ in the constituent unit II, R$^5$ in the constituent unit III, and R$^5$ in the constituent unit IV are the same.

An example of the monovalent hydrocarbon group represented by R$^5$ includes the same monovalent hydrocarbon group as that represented by the above-described R$^1$ and R$^2$. Preferably, a saturated aliphatic hydrocarbon group is used, more preferably, methyl and ethyl are used, or further preferably, methyl is used.

The constituent units I and IV are the constituent units of both ends of the structure.

"a" in the constituent unit II is the number of repeating units of the constituent unit II and represents, in view of reactivity, preferably an integer of 1 to 1000, or more preferably an integer of 1 to 100.

"b" in the constituent unit III is the number of repeating units of the constituent unit III and represents, in view of reactivity, preferably an integer of 2 to 10000, or more preferably an integer of 2 to 1000.

To be specific, examples of the hydride compound represented by the above-described formula (3) include methylhydrogenpolysiloxane, dimethylpolysiloxane-co-methylhydrogenpolysiloxane, ethylhydrogenpolysiloxane, and methylhydrogenpolysiloxane-co-methylphenylpolysiloxane. Preferably, dimethylpolysiloxane-co-methylhydrogenpolysiloxane is used.

These hydride compounds represented by the above-described formula (3) can be used alone or in combination of two or more.

The hydride compound represented by the above-described formula (3) is a mixture of compounds in which "a" and/or "b" are usually different from each other (that is, the molecular weights are different).

Accordingly, "a" in the constituent unit II and "b" in the constituent unit III are respectively calculated as an average value.

The number average molecular weight of the hydride compound represented by the above-described formula (3) is, for example, 100 to 1000000.

Preferably, R$^6$s in the above-described formula (4) are the same. That is, all of the R$^6$s bonded to the silicon atoms at both ends and the R$^6$s bonded to the silicon atom between both ends are the same.

An example of the monovalent hydrocarbon group represented by R$^6$ includes the same monovalent hydrocarbon group as that represented by the above-described R$^1$ and R$^2$. Preferably, methyl and ethyl are used.

In the above-described formula (4), "c" represents, in view of reactivity, preferably an integer of 1 to 10000, or more preferably an integer of 1 to 1000.

To be specific, examples of the hydride compound represented by the above-described formula (4) include a polydimethylsiloxane containing hydrosilyl groups at both ends, a polymethylphenylsiloxane containing hydrosilyl groups at both ends, and a polydiphenylsiloxane containing hydrosilyl groups at both ends.

These hydride compounds represented by the above-described formula (4) can be used alone or in combination of two or more.

The hydride compound represented by the above-described formula (4) is a mixture of compounds in which "c"s are usually different from each other (that is, the molecular weights are different).

Accordingly, "c" in the above-described formula (4) is calculated as an average value.

The number average molecular weight of the hydride compound represented by the above-described formula (4) is, in view of stability and/or handling ability, for example, 100 to 1000000, or preferably 100 to 100000.

The viscosity of the organohydrogensiloxane at 25° C. is, for example, 10 to 100000 mPa·s, or preferably 15 to 50000 mPa·s. The viscosity is measured with a B-type viscometer.

A commercially available product can be used as the organohydrogensiloxane. An organohydrogensiloxane synthesized in accordance with a known method can be also used.

As the organohydrogensiloxane, the hydride compound represented by the above-described formula (3) or the hydride compound represented by the above-described formula (4) can be used alone. Alternatively, the hydride compound represented by the above-described formula (3) and the hydride compound represented by the above-described formula (4) can be used in combination. As the organohydrogensiloxane, preferably, the hydride compound represented by the above-described formula (3) is used alone.

The mixing ratio of the organohydrogensiloxane with respect to 100 parts by mass of the alkenyl group-containing alkoxysilane is, though depending on the molar ratio of the alkenyl group ($R^3$ in the above-described formula (2)) in the alkenyl group-containing alkoxysilane to the hydrosilyl group (the SiH group) in the organohydrogensiloxane, for example, 10 to 10000 parts by mass, or preferably 50 to 1000 parts by mass.

The molar ratio ($R^3$/SiH) of the alkenyl group ($R^3$ in the above-described formula (2)) in the alkenyl group-containing alkoxysilane to the hydrosilyl group (the SiH group) in the organohydrogensiloxane is, for example, 20/1 to 0.05/1, preferably 20/1 to 0.1/1, more preferably 10/1 to 0.1/1, particularly preferably 5/1 to 0.2/1, or most preferably substantially 1/1.

When the molar ratio exceeds the above-described upper limit (20/1), there may be a case where a semi-cured product having an appropriate toughness is not obtained when the silicone resin composition is brought into a B-stage state. On the other hand, when the molar ratio is below the above-described lower limit (0.05/1), the mixing proportion of the organohydrogensiloxane is excessively large, so that the heat resistance and the toughness of the resin layer (the light emitting diode encapsulating layer 2) to be obtained may be insufficient.

When the molar ratio is less than 1/1 and not less than 0.05/1, in allowing the silicone resin composition to be brought into a B-stage state, the silicone resin composition can be quickly transferred into a B-stage state, compared to the silicone resin composition whose molar ratio is 20/1 to 1/1.

The above-described polysiloxane containing silanol groups at both ends, alkenyl group-containing alkoxysilane, and organohydrogensiloxane are blended with a catalyst to be stirred and mixed, so that the silicone resin composition is prepared.

Examples of the catalyst include a condensation catalyst (a semi-curing catalyst) and an addition catalyst (a curing catalyst, a hydrosilylation catalyst).

The condensation catalyst is not particularly limited as long as it is a substance capable of improving the reaction rate of the condensation reaction of the silanol group with the alkoxysilyl group. Examples of the condensation catalyst include an acid such as hydrochloric acid, acetic acid, formic acid, and sulfuric acid; a base such as potassium hydroxide, sodium hydroxide, potassium carbonate, and tetramethylammonium hydroxide; and a metal catalyst such as aluminum, titanium, zinc, and tin.

Of these, in view of compatibility and thermal decomposition characteristics, preferably, a base is used, or more preferably, tetramethylammonium hydroxide is used.

The mixing ratio of the condensation catalyst with respect to 100 mol of the polysiloxane containing silanol groups at both ends is, for example, 0.1 to 50 mol, or preferably 0.5 to 5 mol.

The addition catalyst is not particularly limited as long as it is a substance capable of improving the reaction rate of the addition reaction, that is, the hydrosilylation reaction of the alkenyl group with the SiH. Examples of the addition catalyst include a metal catalyst such as a platinum catalyst including platinum black, platinum chloride, chloroplatinic acid, a platinum olefin complex, a platinum carbonyl complex, and platinum acetyl acetate; a palladium catalyst; and a rhodium catalyst.

Of these, in view of compatibility, transparency, and catalyst activity, preferably, a platinum catalyst is used, or more preferably, a platinum carbonyl complex is used.

The mixing ratio of the addition catalyst with respect to 100 parts by mass of the organohydrogensiloxane is, as the number of parts by mass of the metal amount in the addition catalyst, for example, $1.0 \times 10^{-4}$ to 2.0 parts by mass, preferably $1.0 \times 10^{-4}$ to 1.5 parts by mass, or more preferably $1.0 \times 10^{-4}$ to 1.0 parts by mass.

As the above-described catalyst, a catalyst in a solid state can be used as it is. Alternatively, in view of handling ability, a catalyst dissolved or dispersed in a solvent can be used as a solution or a dispersion liquid.

Examples of the solvent include water and an alcohol such as methanol, ethanol, 1-propanol, and 2-propanol. Preferably, water is used.

In order to prepare the condensation reaction and addition reaction type silicone resin composition, for example, the above-described materials (the condensation materials and the addition materials) and the catalysts are added simultaneously. Alternatively, first, each of the materials and each of the catalysts can be added, respectively, at different timings. In addition, a part of the components can be added simultaneously and each of the remaining components can be added, respectively, at different timings.

Preferably, first, the condensation catalyst is added to the condensation materials and next, the addition materials and the addition catalyst are added thereto simultaneously.

To be specific, in the case of the first thermosetting silicone resin composition, the condensation catalyst is blended into the polysiloxane containing silanol groups at both ends and the alkenyl group-containing alkoxysilane (that is, the condensation materials) at the above-described proportion to be stirred for, for example, 5 minutes to 24 hours.

At the time of blending and stirring, the temperature can be also set to be, for example, 0 to 60° C. so as to improve the compatibility and the handling ability of the condensation materials.

At the time of blending of the materials and the condensation catalyst, a compatibilizing agent for improving the compatibility thereof can be added at an appropriate proportion.

An example of the compatibilizing agent includes an organic solvent such as an alcohol including methanol, ethanol, 1-propanol, and 2-propanol. When the condensation catalyst is prepared as a solution or a dispersion liquid of an organic solvent, the organic solvent can serve as the compatibilizing agent.

The mixing ratio of the compatabilizing agent with respect to 100 parts by mass of the total amount of the polysiloxane containing silanol groups at both ends and the alkenyl group-containing alkoxysilane is, for example, 1 to 20 parts by mass, or preferably 5 to 10 parts by mass.

Thereafter, the pressure in the reaction system (the mixture) is reduced as required, so that a volatile component (the organic solvent) is removed.

Next, the organohydrogensiloxane and the addition catalyst are blended into the obtained mixture of the condensation materials and the condensation catalyst to be stirred for, for example, 1 to 60 minutes.

At the time of blending and stirring, the temperature can be also set to be, for example, 0 to 60° C. so as to improve the compatibility and the handling ability of the mixture and the organohydrogensiloxane.

In this way, the condensation reaction and addition reaction type silicone resin composition can be prepared.

The two-step curable resin can contain a filler as required.

By allowing the resin to contain a filler, the curing shrinkage of the resin at the time of curing is reduced, so that an accurate shape and size of a component can be obtained as designed. Furthermore, the heat resistance and the thermal conductivity can be improved.

Examples of the filler include silicone microparticles, glass, alumina, aluminum hydroxide, silica (fused silica, crystalline silica, ultrafine amorphous silica, hydrophobic ultrafine silica, and the like), talc, clay, and barium sulfate. These fillers can be used alone or in combination of two or more.

Preferably, silicone microparticles are used.

The particle size of the filler is variously selected in accordance with its purpose and use and the maximum particle size thereof is, in view of transparency, for example, 20 μm or less, or preferably 10 μm or less.

The content ratio of the filler with respect to 100 parts by mass of the two-step curable resin is, for example, 1 to 50 parts by mass, or preferably 3 to 30 parts by mass.

A known additive can be added to the two-step curable resin at an appropriate proportion. Examples of the known additive include transmission inhibitors, modifiers, surfactants, dyes, pigments, discoloration inhibitors, and ultraviolet absorbers.

In order to obtain the light emitting diode encapsulating layer 2 using the two-step curable resin, the above-described uncured material (for example, the above-described first thermosetting silicone resin composition or the like) of the two-step curable resin is applied to, for example, a known release paper or the like to undergo the first-step curing (for example, a condensation reaction) by heating.

The heating conditions are the conditions in which the first-step curing (for example, a condensation reaction) is progressed but the second-step curing (for example, an addition reaction (a hydrosilylation reaction)) is not progressed. To be specific, the heating conditions are as follows: a heating temperature of, for example, 40 to 150° C., or preferably 50 to 140° C. and a heating duration of, for example, 1 to 60 minutes, or preferably 3 to 30 minutes.

In this way, the light emitting diode encapsulating layer 2 prepared from a first-step cured material (a resin before final curing (for example, a condensation material or the like)) of the two-step curable resin can be obtained.

An example of a resin having both thermoplastic properties and thermosetting properties includes a silicone resin having both thermoplastic properties and thermosetting properties.

When the silicone resin having both thermoplastic properties and thermosetting properties is used, an excellent light resistance and heat resistance can be ensured.

The silicone resin composition having both thermoplastic properties and thermosetting properties is obtained by allowing a cage octasilsesquioxane to react with an alkenyl group-containing polysiloxane in the presence of a hydrosilylation catalyst.

The cage octasilsesquioxane is an octamer of trifunctional silicone monomer and to be specific, has eight groups represented by the following formula (5),

(where, in formula, $R^7$ represents a monovalent hydrocarbon group and $R^8$ represents hydrogen or a monovalent hydrocarbon group. The molar ratio of the monovalent hydrocarbon group:hydrogen in $R^8$ in the cage octasilsesquioxane as a whole is, as an average value, in the range of 6.5:1.5 to 5.5:2.5.)

To be more specific, the cage octasilsesquioxane is represented by the following formula (6).

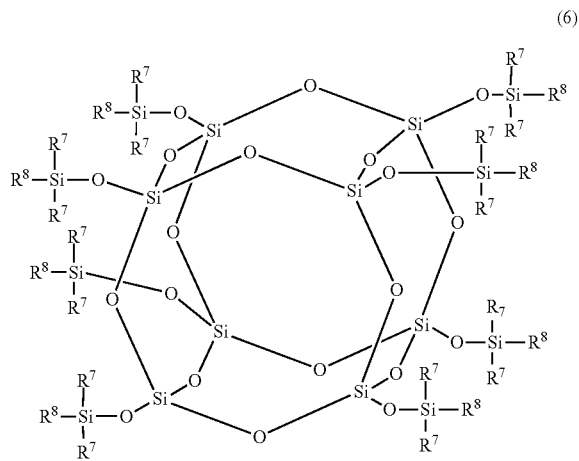

(where, in formula, $R^7$ and $R^8$ are the same as those described above. The molar ratio of the monovalent hydrocarbon group:hydrogen in $R^8$ is the same as that described above.)

In the above-described formulas (5) and (6), an example of the monovalent hydrocarbon group represented by $R^7$ includes a saturated or unsaturated, straight chain, branched chain, or cyclic hydrocarbon group.

To be specific, examples thereof include a saturated straight chain hydrocarbon group (for example, an alkyl group having 1 to 6 carbon atoms such as methyl, ethyl, propyl, butyl, pentyl, and hexyl), a saturated branched chain hydrocarbon group (for example, an alkyl group having 3 to 6 carbon atoms such as isopropyl and isobutyl), a saturated cyclic hydrocarbon group (for example, a cycloalkyl group having 3 to 6 carbon atoms such as cyclohexyl), and an unsaturated cyclic hydrocarbon group (for example, an aryl group having 6 to 8 carbon atoms such as phenyl).

The number of carbon atoms of the monovalent hydrocarbon group is, for example, 1 to 8, or preferably 1 to 6.

$R^7$s may be the same or different from each other. Preferably, $R^7$s are the same.

As the monovalent hydrocarbon group, preferably, in view of easy preparation and thermal stability, a saturated straight chain hydrocarbon group is used, more preferably, an alkyl group having 1 to 6 carbon atoms is used, or particularly preferably, methyl is used.

In the above-described formulas (5) and (6), an example of the monovalent hydrocarbon group represented by $R^8$ includes the same monovalent hydrocarbon group as that represented by $R^7$ described above. Preferably, methyl is used.

The molar ratio of the monovalent hydrocarbon group: hydrogen in $R^8$ in formula (6), in the cage octasilsesquioxane as a whole, is, as an average value, in the range of 6.5:1.5 to 5.5:2.5, or preferably 6.0:2.0 to 5.5:2.5.

That is, in one molecule of the cage octasilsesquioxane, the group represented by the above-described formula (5) forms 1.5 to 2.5 (to be specific, two), or preferably 2 to 2.5 (to be specific, two) of the hydrosilyl groups (—SiH).

When the above-described molar ratio of the monovalent hydrocarbon group:hydrogen in $R^8$ exceeds 6.5/1.5 (=6.5: 1.5) (for example, 7/1 (=7:1)), the number of moles of the hydrosilyl group is excessively small and therefore, the reactivity of the cage octasilsesquioxane with respect to the alkenyl group-containing polysiloxane is excessively reduced. Thus, the molecular weight of the silicone resin to be obtained is reduced and a solid silicone resin may not be obtained.

On the other hand, when the above-described molar ratio of the monovalent hydrocarbon group:hydrogen in $R^8$ is below 5.5/2.5 (=5.5:2.5) (for example, 5/3 (=5:3)), the number of moles of the hydrosilyl group in the cage octasilsesquioxane is excessively large and therefore, the reactivity of the cage octasilsesquioxane with respect to the alkenyl group-containing polysiloxane excessively increases. Thus, the silicone resin may not show the thermoplastic properties.

To be specific, an example of the above-described cage octasilsesquioxane includes a cage octasilsesquioxane having methyl in $R^7$ and methyl or hydrogen in $R^8$ in the above-described formulas (5) and (6) and having a molar ratio of methyl:hydrogen in $R^8$ in the cage octasilsesquioxane as a whole of 5.5:2.5, 6:2, or 6.5:1.5 as an average value.

The cage octasilsesquioxane represented by the above-described formula (6) is, for example, synthesized in accordance with a known method (for example, in conformity with the description in Japanese Unexamined Patent Publication No. 2007-246880).

To be specific, tetraalkoxysilane (tetraethoxysilane and the like) is allowed to react with an alcohol such as methanol and/or with water in the presence of a catalyst to synthesize an octa (silsesquioxane) skeleton (a portion in formula (6) excluding the groups of formula (5)) and thereafter, dialkylchlorosilane (dimethylchlorosilane and the like) and trialkylchlorosilane (trimethylchlorosilane and the like) are blended at a mixing proportion corresponding to the above-described molar ratio of the monovalent hydrocarbon group:hydrogen in $R^8$. Then, an alkoxyl group (ethoxy and the like) bonded to the silicon atom of the octa (silsesquioxane) skeleton is allowed to react with dialkylchlorosilane and trialkylchlorosilane. After the reaction, the product is refined as required. In this way, the cage octasilsesquioxane can be obtained.

A commercially available product can be also used as the cage octasilsesquioxane.

The alkenyl group-containing polysiloxane is a polysiloxane containing alkenyl groups. To be specific, the alkenyl group-containing polysiloxane is represented by the following formula (7).

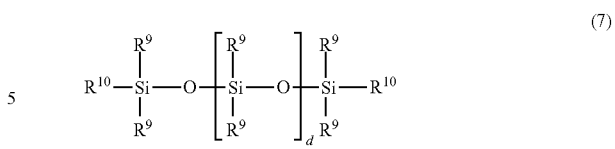

(where, in formula, $R^9$ represents a monovalent hydrocarbon group and $R^{10}$ represents an alkenyl group. "d" represents an integer of 1 or more.)

The monovalent hydrocarbon groups represented by $R^9$ in formula (7) may be the same or different from each other. Preferably, the monovalent hydrocarbon groups represented by $R^9$ are the same.

An example of the monovalent hydrocarbon group represented by $R^9$ includes the same monovalent hydrocarbon group as that represented by $R^7$ in the above-described formulas (5) and (6). Preferably, methyl is used.

Examples of the alkenyl group represented by $R^{10}$ in formula (7) include a substituted or unsubstituted alkenyl group. Preferably, an unsubstituted alkenyl group is used.

An example of the alkenyl group includes an alkenyl group having 2 to 10 carbon atoms such as vinyl, allyl, propenyl, butenyl, and pentenyl.

The number of carbon atoms of the alkenyl group is, for example, 2 to 10, or preferably 2 to 5.

$R^{10}$s be the same or different from each other. Preferably, $R^{10}$s are the same.

As the alkenyl group, preferably, in view of reactivity with the hydrosilyl group in the cage octasilsesquioxane, an alkenyl group having 2 to 5 carbon atoms is used, or more preferably, vinyl is used.

"d" is calculated as the average value in the same manner as "n" in the above-described formula (1) and represents, in view of reactivity and stability, preferably an integer of 1 to 5000, or more preferably an integer of 1 to 1000.

The number average molecular weight of the alkenyl group-containing polysiloxane represented by the above-described formula (7) is, in view of safety and handling ability, for example, 100 to 10000, or preferably 300 to 5000.

The alkenyl group-containing polysiloxane represented by the above-described formula (7) is, for example, synthesized in accordance with a known method. A commercially available product (for example, manufactured by Gelest, Inc.) can be also used.

Examples of the hydrosilylation catalyst include a platinum catalyst such as platinum black, platinum chloride, chloroplatinic acid, a platinum olefin complex, a platinum carbonyl complex, and platinum acetyl acetate; a palladium catalyst; and a rhodium catalyst.

Of the hydrosilylation catalysts, preferably, in view of compatibility and transparency, a platinum catalyst is used, or more preferably, a platinum olefin complex is used. To be specific, a platinum-divinylsiloxane complex such as a platinum-1,3-divinyl-1,1,3,3-tetramethyldisiloxane complex is used.

The hydrosilylation catalyst may be prepared as a solution in a known solvent (such as toluene).

The mixing ratio of the hydrosilylation catalyst (solid content) with respect to 100 parts by mass of the total amount of the cage octasilsesquioxane and the alkenyl group-containing polysiloxane is, for example, $1.0\times10^{-10}$ to 3 parts by mass, or preferably $1.0\times10^{-8}$ to 1 parts by mass.

In the present invention, the cage octasilsesquioxane is allowed to react with the alkenyl group-containing polysiloxane in the presence of the hydrosilylation catalyst so that the number of moles of the hydrosilyl group in the cage octasilsesquioxane is larger (excessive) than that of the alkenyl group in the alkenyl group-containing polysiloxane.

The molar ratio (the number of moles of the alkenyl group/the number of moles of the hydrosilyl group) of the alkenyl group to the hydrosilyl group is below 1, for example, 0.10 to 0.99, preferably 0.20 to 0.99, or more preferably 0.50 to 0.99.

On the other hand, when the above-described molar ratio exceeds the above-described range, the hydrosilyl group is fewer than the alkenyl group. In such a case, the excess of the hydrosilyl group does not remain after the reaction and the thermosetting properties may not be imparted to the silicone resin.

In order to allow the above-described cage octasilsesquioxane to react with the above-described alkenyl group-containing polysiloxane, they are blended at the above-described mixing proportion, along with the hydrosilylation catalyst and the solvent, and thereafter, the mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0 to 100° C., or preferably 20 to 80° C. and the reaction duration is, for example, 0.5 to 96 hours.

In this way, the hydrosilyl group in the cage octasilsesquioxane and the alkenyl group in the alkenyl group-containing polysiloxane are allowed to undergo the hydrosilylation reaction.

The degree of the hydrosilylation reaction can be checked by $^1$H-NMR measurement based on the intensity of a signal derived from the alkenyl group in the alkenyl group-containing polysiloxane. The hydrosilylation reaction is considered to be terminated at the time of disappearance of the signal.

In the above-described hydrosilylation reaction, the cage octasilsesquioxane is allowed to react with the alkenyl group-containing polysiloxane so that the number of moles of the hydrosilyl group is excessive compared with the number of moles of the alkenyl group. Therefore, after the reaction, the excess of the hydrosilyl group remains and the excess of the hydrosilyl group is hydrolyzed with moisture in the air and undergoes a condensation reaction by heating (for example, heating at 100 to 200° C.). Then, the excesses of the hydrosilyl group are bonded to each other (three-dimensional cross-linking) and in this way, the thermosetting properties are imparted to the silicone resin.

In this way, the silicone resin having both thermoplastic properties and thermosetting properties can be obtained.

The obtained silicone resin is in a solid state. The silicone resin in a solid state is obtained because the mobility of the alkenyl group-containing polysiloxane is reduced due to the steric hindrance of the cage octasilsesquioxane.

A resin having both thermoplastic properties and thermosetting properties can contain a filler and an additive at the above-described proportion as required in the same manner as in the above-described two-step curable resin.

In order to obtain the light emitting diode encapsulating layer 2 using the resin having both thermoplastic properties and thermosetting properties, for example, the resin having both thermoplastic properties and thermosetting properties is disposed in a known release paper or the like and then is plasticized by being heated and retained at the thermoplastic temperature.

When the above-described silicone resin having both thermoplastic properties and thermosetting properties is used as the resin having both thermoplastic properties and thermosetting properties, the thermoplastic properties is exhibited based on an increase in mobility of the cage octasilsesquioxane and the alkenyl group-containing polysiloxane by heating.

The thermoplastic temperature of the silicone resin having both thermoplastic properties and thermosetting properties is, for example, 40 to 100° C., or preferably 50 to 90° C. The thermoplastic temperature is the temperature at which the silicone resin shows the thermoplastic properties, to be specific, is the temperature at which the silicone resin in a solid state is softened by heating to be brought into a completely liquid state, and is substantially the same as the softening temperature.

In this way, the light emitting diode encapsulating layer 2 prepared from a thermoplastic material (a resin before final curing) of the resin having both thermoplastic properties and thermosetting properties can be obtained.

The thickness of the light emitting diode encapsulating layer 2 obtained in this way is, for example, 50 to 1000 μm, or preferably 300 to 900 μm.

The phosphor layer 3 is formed from a resin before final curing which is capable of emitting fluorescent light and allowing light to transmit therethrough into a flat plate shape in a generally rectangular shape in plane view. The phosphor layer 3 is provided so as to emit fluorescent light by absorbing light generated from the light emitting diodes 13.

In the phosphor layer 3, examples of the resin before final curing include a first-step cured material of the above-described two-step curable resin and a thermoplastic material (before thermal curing) of the above-described resin having both thermoplastic properties and thermosetting properties.

The phosphor layer 3 contains a phosphor.

An example of the phosphor includes a yellow phosphor which is capable of converting blue light into yellow light. An example of the phosphor includes a phosphor obtained by doping a metal atom such as cerium (Ce) or europium (Eu) into a composite metal oxide, a metal sulfide, or the like.

To be specific, examples of the phosphor include a garnet type phosphor having a garnet type crystal structure such as $Y_3Al_5O_{12}$:Ce (YAG (yttrium aluminum garnet):Ce), $(Y, Gd)_3Al_5O_{12}$:Ce, $Tb_3Al_3O_{12}$:Ce, $Ca_3Sc_2Si_3O_{12}$:Ce, and $Lu_2CaMg_2(Si, Ge)_3O_{12}$:Ce; a silicate phosphor such as $(Sr, Ba)_2SiO_4$:Eu, $Ca_3SiO_4Cl_2$:Eu, $Sr_3SiO_5$:Eu, $Li_2SrSiO_4$:Eu, and $Ca_3Si_2O_7$:Eu; an aluminate phosphor such as $CaAl_{12}O_{19}$:Mn and $SrAl_2O_4$:Eu; a sulfide phosphor such as ZnS:Cu,Al, CaS:Eu, $CaGa_2S_4$:Eu, and $SrGa_2S_4$:Eu; an oxynitride phosphor such as $CaSi_2O_2N_2$:Eu, $SrSi_2O_2N_2$:Eu, $BaSi_2O_2N_2$:Eu, and Ca-α-SiAlON; a nitride phosphor such as $CaAlSiN_3$:Eu and $CaSi_5N_8$:Eu; and a fluoride-based phosphor such as $K_2SiF_6$:Mn and $K_2TiF_6$:Mn. Preferably, a garnet type phosphor is used, or more preferably, $Y_3Al_5O_{12}$:Ce is used.

The phosphor is in the form of a particle. The shape thereof is not particularly limited and examples of the shape thereof include a generally sphere shape, a generally flat plate shape, and a generally needle shape.

The average particle size (the average of the maximum length) of the phosphor is, for example, 0.1 to 30 μm, or preferably 0.2 to 20 μm. The average particle size of the phosphor particle is measured with a particle size distribution analyzer.

The phosphors can be used alone or in combination.

When the resin which forms the phosphor layer 3 contains the phosphor, the fluorescent light can be efficiently emitted from the phosphor layer 3.

For example, in the light emitting diode device 11, a blue light emitting diode or the like is used as the light emitting diode 13. The light emitting diode device 11 can serve as, for example, the light emitting diode device 11 which generates white light (a white light emitting diode) by color mixing of light generated from the light emitting diode 13 with light generated from the phosphor.

The content ratio of the phosphor with respect to 100 parts by mass of the resin before final curing is, for example, 1 to 50 parts by mass, or preferably 3 to 35 parts by mass.

In order to allow the resin before final curing to contain the phosphor, the above-described phosphor is blended with the resin before final curing to be stirred and mixed. The stirring duration is, for example, 0.5 to 2 hours.

The phosphor layer 3 can contain the above-described filler as required in the same manner as in the above-described light emitting diode encapsulating layer 2.

As the filler, preferably, silica is used.

The particle size of the filler is variously selected in accordance with its purpose and use. The maximum particle size of the filler is, in view of transparency, for example, 50 nm or less, or preferably 20 nm or less. To be more specific, an example of the filler includes nano-silica (silica in the form of nano-microparticles).

The content ratio of the filler with respect to 100 parts by mass of the resin before final curing is, for example, 1 to 50 parts by mass, or preferably 3 to 30 parts by mass.

The phosphor layer 3 can be obtained as a resin before final curing in the same manner as in the light emitting diode encapsulating layer 2.

The thickness of the phosphor layer 3 is, for example, 40 to 500 μm, or preferably 50 to 200 μm.

The thickness of the phosphor layer 3 with respect to that of the light emitting diode encapsulating layer 2 is, for example, 10 to 40%.

The light emitting diode encapsulating material 1 can be obtained by attaching the light emitting diode encapsulating layer 2 to the phosphor layer 3.

For example, the light emitting diode encapsulating layer 2 and the phosphor layer 3 which are prepared from a resin before final curing are attached to each other and then, are heated at, for example, 100 to 150° C., or preferably 110 to 140° C. for, for example, 0.5 to 5 minutes, or preferably 1 to 3 minutes, so that the light emitting diode encapsulating material 1 can be obtained while the state before final curing of the light emitting diode encapsulating layer 2 and the phosphor layer 3 is maintained.

To be specific, when both of the light emitting diode encapsulating layer 2 and the phosphor layer 3 are a first-step cured material (in a B-stage state) of a two-step curable resin, the light emitting diode encapsulating layer 2 and the phosphor layer 3 are attached to each other and then, are heated at, for example, 100 to 150° C., or preferably 110 to 140° C. for, for example, 0.5 to 5 minutes, or preferably 1 to 3 minutes, so that the light emitting diode encapsulating material 1 can be obtained while the state before curing in the second step of the light emitting diode encapsulating layer 2 and the phosphor layer 3 is maintained.

Also, when both of the light emitting diode encapsulating layer 2 and the phosphor layer 3 are a thermoplastic material (before thermal curing) of a resin having both thermoplastic properties and thermosetting properties, the light emitting diode encapsulating layer 2 and the phosphor layer 3 are attached to each other and then, are heated at, for example, 100 to 150° C., or preferably 110 to 140° C. for, for example, 0.5 to 5 minutes, or preferably 1 to 3 minutes, so that the light emitting diode encapsulating material 1 can be obtained while the state before thermal curing of the light emitting diode encapsulating layer 2 and the phosphor layer 3 is maintained.

The thickness of the light emitting diode encapsulating material 1 is, for example, 90 to 1500 μm, or preferably 350 to 1000 μm.

According to the light emitting diode encapsulating material 1, though described later in details, the light emitting diodes 13 are encapsulated by the hemispherical light emitting diode encapsulating layer 2; at the same time, the light emitting diode encapsulating material 1 can be formed into a hemispherical shape; and furthermore, the phosphor layer 3 can be disposed on the hemispherical surface of the light emitting diode encapsulating layer 2, so that the light emitting diode device 11 (described later) is capable of being produced easily and accurately with a small number of operating steps.

Next, in this method, as shown in FIG. 2 (d), the above-described light emitting diode encapsulating material 1 is disposed between the board 12 and the lens molding die 16 so that the phosphor layer 3 is opposed to the lens molding die 16, and as shown in FIG. 2 (e), compression molding is performed so that the light emitting diode encapsulating material 1 is sandwiched between the board 12 and the lens molding die 16.

Practically, the light emitting diode encapsulating material 1 is disposed on the lens molding die 16 (at the side where dents are formed) and thereafter, the board 12 provided with the light emitting diodes 13 is disposed thereon so that the light emitting diodes 13 are opposed to the light emitting diode encapsulating material 1 to be compressively molded.

In the compression molding, a compression pressure is, for example, 0.1 to 5 MPa, or preferably 0.5 to 3 MPa and a compression duration is, for example, 1 to 15 minutes, or preferably 2 to 10 minutes.

At this time, the light emitting diode encapsulating material 1 is formed so as to follow the lens molding die 16 while being extended by, for example, 20 to 30 μm.

In this way, the light emitting diodes 13 are directly encapsulated by the hemispherical light emitting diode encapsulating layer 2 and the phosphor layer 3 is disposed on the hemispherical surface of the light emitting diode encapsulating layer 2.

In this method, for example, along with the compression molding, the light emitting diode encapsulating material 1 is subjected to a heating process, so that the resin before final curing can be subjected to the final curing.

The heating process usually includes a first step in which a curing is performed to such a degree that the light emitting diode encapsulating layer 2 and the phosphor layer 3 in the light emitting diode encapsulating material 1 are capable of being released, and a second step in which a final curing is performed after being released from the lens molding die 16.

The heating conditions in the heating process are the conditions in which the light emitting diode encapsulating layer 2 and the phosphor layer 3 prepared from a resin before final curing are subjected to the final curing. The heating conditions are as follows: in the first step, for example, a temperature of 120 to 180° C. and a duration of 2 to 20 minutes, and in the second step, for example, a temperature of 100 to 180° C. and a duration of 30 minutes to 5 hours.

To be specific, when the light emitting diode encapsulating layer 2 and the phosphor layer 3 are prepared from a first-step cured material of a two-step curable resin, the heating conditions are the conditions in which a curing in the second step (for example, an addition reaction (a hydrosilylation reaction)) is progressed and to be specific, are the conditions as follows: in the first step, for example, a temperature of 120 to 180° C. and a duration of 2 to 20 minutes, and in the second step, for example, a temperature of 100 to 180° C. and a duration of 30 minutes to 5 hours.

When both of the light emitting diode encapsulating layer 2 and the phosphor layer 3 are a thermoplastic material (before thermal curing) of a resin having both thermoplastic properties and thermosetting properties, the heating conditions are the conditions in which a thermal curing reaction is progressed and to be specific, are the conditions as follows: in the first step, for example, a temperature of 120 to 180° C. and a duration of 2 to 20 minutes, and in the second step, for example, a temperature of 100 to 180° C. and a duration of 30 minutes to 5 hours.

By performing the compression molding (and the heating process as required) in this way, the light emitting diode encapsulating material 1 can be cured in a state where the light emitting diode encapsulating layer 2 encapsulates the light emitting diodes 13 and in a shape where the light emitting diode encapsulating material 1 corresponds to the lens molding die 16. In this way, a light emitting diode encapsulating layer 15 (the light emitting diode encapsulating layer 2 after curing) and the phosphor cover 14 (the phosphor layer 3 after curing) can be formed at the same time.

In this method, preferably, after the compression molding, the light emitting diode encapsulating material 1, the lens molding die 16, and the light emitting diodes 13 are positioned so that the phosphor layer 3 in the light emitting diode encapsulating material 1 is disposed at a substantially equal distance from the central point of each of the light emitting diodes 13.

When the phosphor layer 3 (and the phosphor cover 14 after curing of the phosphor layer 3) is disposed at an equal distance from the central point of each of the light emitting diodes 13, the optical path length from the optical source to the phosphor layer 3 becomes uniform (ref: arrows in FIG. 2 (*e*)).

To be specific, when a difference between the maximum length and the minimum length in distance from the central point in plane view of the most upper surface (the other side with respect to the board 12) of each of the light emitting diodes 13 to the inner side surface (the surface at the light emitting diode 13 side) of the phosphor layer 3 is in the range of 0 to 50 μm, it is defined that the phosphor layer 3 is at a substantially equal distance from the central point of each of the light emitting diodes 13.

According to the method for producing a light emitting diode device, the light distribution characteristics can be improved and the light emitting diode device which is capable of widely emitting light can be produced.

Thereafter, if necessary, as shown in FIG. 2 (*f*), the light emitting diodes 13 are cut into single pieces so that each of the light emitting diodes 13 is individualized. In this way, the light emitting diode device 11 can be obtained.

In this way, according to the method for producing the light emitting diode device 11 of the present invention, the light emitting diodes 13 can be encapsulated by the hemispherical light emitting diode encapsulating layer 2 prepared from the resin before final curing and at the same time, the phosphor layer 3 can be disposed on the hemispherical surface thereof. Therefore, after encapsulating the light emitting diodes 13, a lens or the phosphor cover 14 are not required to be separately disposed, so that the light emitting diode device 11 is capable of being produced easily and accurately with a small number of operating steps.

EXAMPLES

While the present invention will be described hereinafter in further detail with reference to Examples and Comparative Examples, the present invention is not limited to these Examples and Comparative Examples.

Example 1

Preparation of Silicone Resin Composition

After stirring and mixing 100 g (8.70 mmol) of a dual-end silanol type silicone oil (trade name: X-21-5842, manufactured by Shin-Etsu Chemical Co., Ltd., a number average molecular weight of 11500); 0.86 g (5.80 mmol, the molar ratio (SiOH/methoxy group) of a SiOH group in the dual-end silanol type silicone oil to a methoxy group in the vinyltrimethoxysilane=17/17) of vinyltrimethoxysilane (trade name: KBM-1003, manufactured by Shin-Etsu Chemical Co., Ltd.); and 10 mL (8 parts by mass with respect to 100 parts by mass of the total amount of the dual-end silanol type silicone oil and the vinyltrimethoxysilane) of 2-propanol, 0.16 mL (0.17 mmol, 2.0 mol with respect to 100 mol of the dual-end silanol type silicone oil) of an aqueous solution of tetramethylammonium hydroxide (a concentration: 10 mass %), as a condensation catalyst, was added thereto and the obtained mixture was stirred at room temperature (25° C.) for 2 hours. Then, 0.75 g (the molar ratio (vinyl group/SiH) of a vinyl group in the vinyltrimethoxysilane to a SiH group in the organohydrogenpolysiloxane=1/1) of an organohydrogenpolysiloxane (a methylhydrogenpolysiloxane, trade name: KF-9901, manufactured by Shin-Etsu Chemical Co., Ltd.) and 0.26 mL (35 parts by mass with respect to 100 parts by mass of the organohydrogenpolysiloxane) of a solution of a platinum carbonyl complex (a platinum concentration: 2 mass %), as a hydrosilylation catalyst, were added to the obtained oil, so that a silicone resin composition was obtained.

<Production of Light Emitting Diode Encapsulating Layer>

30 parts by mass of silicone microparticles (polymethylsilsesquioxane microparticles, trade name: Tospearl 2000B, manufactured by Momentive Performance Materials Inc., an average particle size of 6.0 μm) were added to 100 parts by mass of the silicone resin composition obtained in <Preparation of Silicone Resin Composition>.

The obtained mixture was applied to a release paper and then, was dried at 135° C. for 12 minutes, so that a light emitting diode encapsulating layer in a semi-cured state (in a B-stage state) having a thickness of 900 μm was obtained.

<Production of Phospohr Layer>

5 parts by mass of nano-silica (dimethylsilylated silica, trade name: AEROSIL R976S, manufactured by Nippon Aerosil Co., Ltd., an average particle size of 7 nm) and 35 parts by mass of a phosphor ($Y_3Al_5O_{12}$:Ce (YAG:Ce), a sphere shape, an average particle size of 17 μm) were added to 100 parts by mass of the silicone resin composition obtained in <Preparation of Silicone Resin Composition>.

The obtained mixture was applied to a release paper and then, was dried at 135° C. for 3 minutes, so that a phosphor layer prepared from a silicone resin composition in a semi-cured state (in a B-stage state) having a thickness of 100 μm was obtained.

<Production of Light Emitting Diode Encapsulating Material>

The light emitting diode encapsulating layer and the phosphor layer obtained by the description above were attached to each other to be heated at 120° C. for 3 minutes, so that a light emitting diode encapsulating material having a thickness of 1000 μm was obtained.

In the light emitting diode encapsulating material, the light emitting diode encapsulating layer and the phosphor layer maintained a semi-cured state (a B-stage state).

<Production of Light Emitting Diode Device>

On the upper surface of a board in which a wire was formed, 100 pieces (10×10 in arrangement) of blue light emitting diodes were mounted (ref: FIG. 1 (a)).

Next, a lens molding die in which 100 pieces of hemispherical dents were formed was prepared (ref: FIG. 1 (b)), and the light emitting diode encapsulating material (ref: FIG. 1 (c)) obtained by the description above was disposed between the lens molding die and the board so that the phosphor layer was opposed to the lens molding die (ref: FIG. 2 (d)).

Next, the light emitting diode encapsulating material was sandwiched between the board and the lens molding die to be compressively molded at 1.6 MPa and heated at 160° C. for 10 minutes (ref: FIG. 2 (e)). Thereafter, the obtained product was demolded and was heated at 150° C. for 3 hours to be completely cured. Then, the resulting product was cut into single pieces, so that 100 pieces of the light emitting diode devices were produced (ref: FIG. 2 (f)).

In this way, the light emitting diodes were encapsulated by the hemispherical light emitting diode encapsulating layer and at the same time, lenses were molded and the phosphor layer could be integrally molded on the hemispherical surfaces thereof.

In this way, the light emitting diode device was capable of being produced easily and accurately with a small number of operating steps.

The sectional photographic view of the obtained light emitting diode device is shown in FIG. 3.

Comparative Example 1

Production of Light Emitting Diode Encapsulating Layer

A light emitting diode encapsulating layer was obtained in the same manner as in Example 1, except that a solution of a silicone elastomer (a dimethylsiloxane skeleton derivative, trade name: LR7556, manufactured by WACKER ASAHIKASEI SILICONE CO., LTD.) was used instead of the silicone resin composition obtained in <Preparation of Silicone Resin Composition>, and the drying conditions were changed to be 150° C. for 10 minutes.

<Production of Phosphor Layer>

A phosphor layer was obtained in the same manner as in Example 1, except that a solution of a silicone elastomer (a dimethylsiloxane skeleton derivative, trade name: LR7556, manufactured by WACKER ASAHIKASEI SILICONE CO., LTD.) was used instead of the silicone resin composition obtained in <Preparation of Silicone Resin Composition>, and the drying conditions were changed to be 150° C. for 10 minutes.

<Production of Light Emitting Diode Encapsulating Material>

A light emitting diode encapsulating material was obtained in the same manner as in Example 1.

<Production of Light Emitting Diode Device>

A light emitting diode device was obtained in the same manner as in Example 1.

In the obtained light emitting diode device, a crack occurred in the phosphor layer.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing a light emitting diode device comprising the steps of:
   preparing a board mounted with a light emitting diode;
   preparing a hemispherical lens molding die;
   preparing a light emitting diode encapsulating material which includes a light emitting diode encapsulating layer and a phosphor layer disposed on the light emitting diode encapsulating layer, and in which both of the light emitting diode encapsulating layer and the phosphor layer are prepared from a resin before final curing; and
   disposing the light emitting diode encapsulating material between the board and the lens molding die so that the phosphor layer faces the lens molding die and the light emitting diode encapsulating layer faces the board to compressively mold both of the light emitting diode encapsulating layer and the phosphor layer at the same time, so that the light emitting diode is directly encapsulated by the hemispherical light emitting diode encapsulating layer and the phosphor layer is disposed on the hemispherical surface of the light emitting diode encapsulating layer.

2. The method for producing a light emitting diode device according to claim 1, wherein the phosphor layer is disposed at an equal distance from the central point of the light emitting diode.

3. The method for producing a light emitting diode device according to claim 1, wherein the resin before final curing is a first-step cured material of a two-step curable resin and/or a thermoplastic material of a resin having both thermoplastic properties and thermosetting properties.

* * * * *